US012707783B2

(12) United States Patent
Han et al.

(10) Patent No.: US 12,707,783 B2
(45) Date of Patent: Aug. 11, 2026

(54) DISPLAY DEVICE USING SEMICONDUCTOR LIGHT-EMITTING ELEMENT

(71) Applicant: LG ELECTRONICS INC., Seoul (KR)

(72) Inventors: Seoungkyu Han, Seoul (KR); Myungwhun Chang, Seoul (KR); Okhee Yun, Seoul (KR); Yanghyun Kim, Seoul (KR); Seungho Ryoo, Seoul (KR); Wonsik Kim, Seoul (KR); Jonggon Shin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 409 days.

(21) Appl. No.: 18/274,162

(22) PCT Filed: Jun. 2, 2022

(86) PCT No.: PCT/KR2022/007819
§ 371 (c)(1),
(2) Date: Jul. 25, 2023

(87) PCT Pub. No.: WO2023/234439
PCT Pub. Date: Dec. 7, 2023

(65) Prior Publication Data
US 2025/0031503 A1 Jan. 23, 2025

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC .... H10H 20/857; H10H 29/49; H10H 29/142; H01L 25/0753; H10D 86/441
See application file for complete search history.

(56) References Cited

U.S. PATENT DOCUMENTS 11,616,173 B2 * 3/2023 Wang .................. H10H 20/854 257/99
2019/0019781 A1 * 1/2019 Lebrun ............... H10H 20/857
(Continued)

FOREIGN PATENT DOCUMENTS

CN 107086266 A * 8/2017 ......... H01L 25/0753
CN 110706647 1/2020
(Continued)

OTHER PUBLICATIONS

Koo et al. KR20190070588, machine translation Jun. 2019 (Year: 2019).*
(Continued)

*Primary Examiner* — Tracie Y Green
(74) *Attorney, Agent, or Firm* — LEE, HONG, DEGERMAN, KANG & WAIMEY

(57) ABSTRACT

The present disclosure is applicable to a display device-related technical field, and relates to, for example, a display device using a micro light emitting diode (LED). Disclosed is a display device using a light-emitting element including a wiring substrate having multiple unit pixel areas defined therein, a wiring electrode including first wiring electrodes and a second wiring electrode arranged on the wiring substrate, and each light-emitting element installed in each unit pixel area so as to be electrically connected to each first wiring electrode and the second wiring electrode to constitute each sub-pixel, wherein the light-emitting elements include a first light-emitting element located in a first pixel area and installed in a first arrangement, and a second light-emitting element located in a second pixel area adjacent to the first pixel area and installed in a second arrangement symmetrical to the first arrangement.

16 Claims, 13 Drawing Sheets

(56) References Cited

U.S. PATENT DOCUMENTS

| | | | | |
|---|---|---|---|---|
| 2021/0257525 | A1 | 8/2021 | Ryu et al. | |
| 2022/0077228 | A1 | 3/2022 | Do et al. | |
| 2022/0130924 | A1 | 4/2022 | Takahashi et al. | |
| 2023/0069883 | A1* | 3/2023 | Jang | H10H 20/857 |
| 2024/0079386 | A1* | 3/2024 | Chang | H10H 20/819 |
| 2024/0079387 | A1* | 3/2024 | Chang | H10H 20/819 |
| 2025/0046761 | A1* | 2/2025 | Kim | H10W 90/00 |

FOREIGN PATENT DOCUMENTS

| | | |
|---|---|---|
| CN | 113571627 | 10/2021 |
| EP | 3913678 | 11/2021 |
| EP | 3968383 | 3/2022 |
| JP | 2002-374004 | 12/2002 |
| JP | 2021136335 | 9/2021 |
| KR | 10-2009-0128883 | 12/2009 |
| KR | 10-2012-0057727 | 6/2012 |
| KR | 10-2019-0008124 | 1/2019 |
| KR | 10-2019-0070588 | 6/2019 |
| KR | 10-2020-0146014 | 12/2020 |
| WO | 2020256272 | 12/2020 |

OTHER PUBLICATIONS

Kozumi et al., JP2002-374004, machine translation, Dec. 2002 (Year: 2002).*

Mai et al., CN113571627A, machine translation Jan. 2019 (Year: 2019).*

CN-107086266-A (Year: 2017).*

PCT International Application No. PCT/KR2022/007819, International Search Report dated Mar. 2, 2023, 11 pages.

European Patent Office Application Serial No. 22908809.1, Search Report dated Mar. 9, 2026, 12 pages.

The State Intellectual Property Office of the People's Republic of China Application Serial No. 202280011755.4, Office Action dated Mar. 19, 2026, 32 pages.

* cited by examiner 410
500
410
500
M
M
1.
2.
231
230
230a
230b
230c
230d
(A)
(B)
(C)
#1
#2
#3
#4

(A)

(B)

(C)

DISPLAY DEVICE USING SEMICONDUCTOR LIGHT-EMITTING ELEMENT

CROSS-REFERENCE TO RELATED APPLICATION(S)

This application is the National Stage filing under 35 U.S.C. 371 of International Application No. PCT/KR2022/007819, filed on Jun. 2, 2022, the contents of which is hereby incorporated by reference herein in its entirety.

TECHNICAL FIELD

The present disclosure is applicable to a display device-related technical field, and relates to, for example, a display device using a micro light emitting diode (LED).

BACKGROUND

Recently, display devices with excellent characteristics such as thinness and flexibility are being developed in a field of display technology. Currently, commercially available major displays are represented by a liquid crystal display (LCD) and an organic light emitting diode (OLED).

In one example, a light emitting diode (LED), as a well-known semiconductor light-emitting device that converts current into light, has been used as a light source for an image displayed in electronic devices including an information and communication device along with a GaP:N-based green LED, starting with commercialization of a red LED using a GaAsP compound semiconductor in 1962.

Recently, such light emitting diode (LED) has been gradually miniaturized and manufactured as a micrometer-sized LED to be used for pixels or flat lighting of the display device.

Sapphire, which is used as a substrate on which a gallium nitride-based semiconductor is grown, has a tilted crystal surface. For example, a R-plane has a crystal surface tilted along a m-axis. The ordinary sapphire may have the R-plane as a growth plane. Because the R-plane has a surface tilted with respect to a hexagonal prism crystal shape, the sapphire substrate and the gallium nitride-based semiconductor grown on the crystal surface of the sapphire substrate may have such a tilt angle.

In addition, such a tilt angle may also be formed as a light-emitting device is formed as the gallium nitride-based semiconductor on the sapphire substrate and then is cut in a direction of the crystal surface of the sapphire substrate.

Accordingly, when the light-emitting device is mounted on a wiring substrate in a general arrangement and emits light, an individual sub-pixel may be constructed in a state having an asymmetrical light distribution with respect to a direction for connecting two electrode pads with respect to one light-emitting device and the individual sub-pixels may constitute the display device.

As such, when the display device is formed with the individual sub-pixels with the asymmetrical light distribution, a problem in that, when viewing the display device from the outside, a color of a display appears differently depending on a viewing direction may occur.

In addition, an unintended parasitic capacitance may occur due to an electric field formed by a difference in polarity between a signal electrode/a common electrode of the light-emitting device.

Accordingly, even when the electric field is dissipated, discharge of the parasitic capacitance may not be normally performed, and thus a situation in which an adjacent light-emitting device is unintentionally turned on may occur.

The corresponding effect may be accumulated by the total number of light-emitting devices used in the display device, and finally, a ghost phenomenon may appear in a unit of a display product.

Therefore, there is a demand for a method capable of solving such problem.

SUMMARY

Technical Problem

The present disclosure is to provide a display device using a semiconductor light-emitting device that may cancel the biased light distributions of the light-emitting devices caused by the crystallinity of the light-emitting devices.

In addition, the present disclosure is to provide a display device using a semiconductor light-emitting device that may solve a problem in that, when viewing the display device from the outside, a color of a display appears differently depending on a viewing direction.

In addition, the present disclosure is to provide a display device using a semiconductor light-emitting device that may reduce a parasitic capacitance caused by a difference in electrical polarity between the light-emitting devices.

In addition, the present disclosure is to provide a display device using a semiconductor light-emitting device that may cancel an electric field generated by a difference in electrical polarity between the light-emitting devices.

In addition, according to an embodiment of the present disclosure, the present disclosure is to provide a display device using a semiconductor light-emitting device that may visually reinforce an area with weak color when viewing the display from one side to correct a color difference of the display perceived on left and right sides.

Technical Solutions

A display device using a light-emitting device according to the present disclosure includes a wiring substrate having multiple unit pixel areas defined therein, a wiring electrode including first wiring electrodes and a second wiring electrode arranged on the wiring substrate, and each light-emitting device installed in each unit pixel area so as to be electrically connected to each first wiring electrode and the second wiring electrode to constitute each sub-pixel, and the light-emitting devices include a first light-emitting device located in a first pixel area and installed in a first arrangement, and a second light-emitting device located in a second pixel area adjacent to the first pixel area and installed in a second arrangement symmetrical to the first arrangement.

According to an embodiment, a parasitic capacitance generated by a difference in electrical polarity between the first light-emitting device and the second light-emitting device may be reduced by the first arrangement and the second arrangement.

According to an embodiment, positions of electrodes of the first light-emitting device and the second light-emitting device may be symmetrical to each other in the first arrangement and the second arrangement.

According to an embodiment, the first wiring electrode corresponding to the first pixel area and an adjacent first wiring electrode corresponding to the second pixel area may be symmetrically positioned with respect to each other around a center point between the first pixel area and the second pixel area.

According to an embodiment, the center point between the first pixel area and the second pixel area may correspond to the second wiring electrode.

According to an embodiment, the first pixel area and the second pixel area may form a pair between the first wiring electrode and a first wiring electrode adjacent thereto.

According to an embodiment, an electric field generated by a difference in electric polarity between the first light-emitting device and the second light-emitting device may be canceled by the first arrangement and the second arrangement.

According to an embodiment, a side surface of each of the first light-emitting device and the second light-emitting device may be tilted to have a tilt angle.

According to an embodiment, the first light-emitting device and the second light-emitting device may be tilted symmetrical to each other to have the same tilt angles in opposite directions by the first arrangement and the second arrangement.

According to an embodiment, each light-emitting device may include a first-type electrode and a second-type electrode, and have an asymmetric light distribution with respect to a direction for connecting the first-type electrode and the second-type electrode to each other.

According to an embodiment, the asymmetric light distributions may be canceled with each other by the first arrangement and the second arrangement.

According to an embodiment, the first light-emitting device and the second light-emitting device may emit light of the same color.

A display device using a light-emitting device according to the present disclosure includes a wiring substrate having multiple unit pixel areas defined therein, a wiring electrode including first wiring electrodes and a second wiring electrode arranged on the wiring substrate, and each light-emitting device installed in each unit pixel area so as to be electrically connected to each first wiring electrode and the second wiring electrode to constitute each sub-pixel, and the light-emitting devices include a first light-emitting device located in a first sub-pixel area and installed in a first arrangement, and a second light-emitting device located in a second sub-pixel area adjacent to the first sub-pixel area and installed in a second arrangement symmetrical to the first arrangement with respect to the first wiring electrode.

Advantageous Effects

According to one embodiment of the present disclosure, the following effects are obtained.

First, according to one embodiment of the present disclosure, the biased light distributions of the light-emitting devices resulting from the crystallinity of the light-emitting devices may be cancelled with each other. That is, the asymmetrical light distributions of the light-emitting devices may be canceled.

Accordingly, the problem in that, when viewing the display device from the outside, the color of the display appears differently depending on the viewing direction may be solved.

In addition, according to one embodiment of the present disclosure, the parasitic capacitance generated by the difference in the electrical polarity of the light-emitting devices may be reduced.

In addition, the ghost phenomenon that may occur due to such parasitic capacitance may be reduced.

In addition, according to one embodiment of the present disclosure, the electric field generated by the difference in the electrical polarity between the light-emitting devices may be canceled.

In addition, according to one embodiment of the present disclosure, the area with the weak color may be visually reinforced when viewing the display from one direction to correct the color difference between the left and right sides of the display. Therefore, the effect of enhancing the color viewing angle in the final product stage of the display device may be obtained.

Furthermore, according to another embodiment of the present disclosure, there are additional technical effects not mentioned here. A person skilled in the art may understand this via the entire meaning of the present document and drawings.

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

A semiconductor light-emitting device mentioned herein is a concept including an LED, a micro LED, and the like, and is able to be used interchangeably with those.

Figure 1:
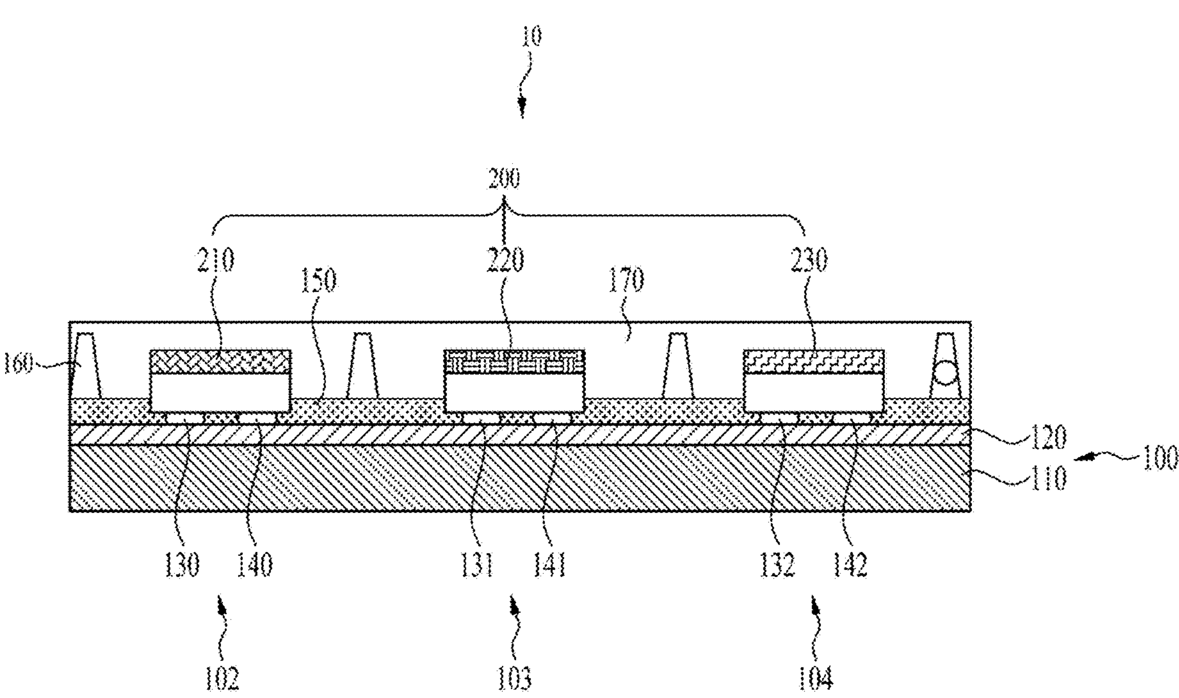
FIG. 1 is a schematic diagram of a display device using a semiconductor light-emitting device according to an embodiment of the present disclosure.

FIG. 1 is a schematic diagram of a display device using a semiconductor light-emitting device according to an embodiment of the present disclosure.

Referring to FIG. 1, in a display device 10, an individual unit pixel area 101 may be partitioned on a wiring substrate 100, and multiple light-emitting devices 200:210, 220, and 230 may be installed within such unit pixel area 101.

In this regard, the individual light-emitting devices 210, 220, and 230 installed in the unit pixel area 101 may substantially correspond to sub-pixels, respectively. For example, three sub-pixels may be gathered to constitute one pixel. In FIG. 1, the three light-emitting devices 210, 220, and 230 may correspond to red, green, and blue light-emitting devices, respectively.

Each of the light-emitting devices 210, 220, and 230 may be electrically connected to a pair of electrode pads 130 and 140/131 and 141/132 and 142. In this case, as an example, the electrode pads 130, 131, and 132 (hereinafter, referred to as first electrode pads) arranged on one side in FIG. 1 may be connected to first wiring electrodes (signal electrodes or data electrodes) 121, 122, and 123, respectively.

In addition, the electrode pads 140, 141, and 142 arranged on the other side (hereinafter, referred to as second electrode pads) may be connected to a second wiring electrode (a common electrode or a scan electrode) 124. However, an opposite case thereof is also possible. In FIG. 1, the signal electrodes 121, 122, and 123 and the common electrode 124 are omitted due to an arrangement of electrodes and pads.

In one example, in some cases, the first electrode pads 130, 131, and 132 may respectively correspond to the signal electrodes 121, 122, and 123, and the second electrode pads 140, 141, and 142 may correspond to the common electrode 124.

Hereinafter, reference numerals of the electrode pads and the wiring electrodes are used interchangeably for description. That is, the electrode pads and the wire electrodes may be described using the same reference numerals.

As such, unit sub-pixels may be defined at points where the first wiring electrodes 121, 122, and 123 and the second wiring electrode 124 intersect each other.

In one example, when the first wiring electrodes 121, 122, and 123 are the signal electrodes (or the data electrodes), such first wiring electrodes 121, 122, and 123 or the first electrode pads 130, 131, and 132 may be connected to a TFT layer 120 on which a thin film transistor (TFT) is disposed. Accordingly, each of the light-emitting devices 210, 220, and 230 may be driven by switching driving resulted from such TFT layer 120.

In FIG. 1, the TFT layer 120 is briefly shown as a single layer, but the TFT layer 120 may include multiple TFT areas capable of performing the switching operation. For example, each TFT area may include a gate electrode, a source electrode, a drain electrode, an insulating layer disposed therebetween, a via electrode that may be connected to the first wiring electrodes 121, 122, and 123 or the first electrode pads 130, 131, and 132, and the like. A detailed description of this is omitted. Each of such TFT areas may be connected to each of the light-emitting devices 210, 220, and 230.

The multiple light-emitting devices 200; 210, 220, and 230 may be installed to be electrically connected onto the wiring electrodes 121, 122, 123, and 124 to form individual sub-pixels.

As mentioned above, such light-emitting devices 200 may include the red light-emitting device 210, the green light-emitting device 220, and the blue light-emitting device 230, and such three light-emitting devices 210, 220, and 230 may form the individual sub-pixels and be repeatedly positioned on the wiring substrate 100. Such light-emitting devices 210, 220, and 230 may include at least one of an organic light-emitting device and an inorganic light-emitting device. For example, the light-emitting devices 210, 220, and 230 may be the inorganic semiconductor light-emitting devices (light emitting diodes: LEDs).

Such semiconductor light-emitting device (LED) 200 may have a size of a micrometer (μm) unit. The micrometer (μm) size may mean that a width of at least one surface of the light-emitting device 200 has a size of several to hundreds of micrometers (μm).

The TFT layer 120 may be positioned on a substrate 110, and an insulating layer 150 may be coated on the TFT layer 120. Such insulating layer 150 may be coated on a connection portion between the wiring electrodes 121, 122, 123, and 124, the electrode pads 130, 131, 132/140, 141, and 142, and the light-emitting devices 210, 220, and 230.

For example, the individual light-emitting devices 210, 220, and 230 may be separated from each other by a partition wall 160. In addition, a cover layer 170 may be positioned on the light-emitting devices 210, 220, and 230 and the partition wall 160.

As described above, the light-emitting devices 210, 220, and 230 may form the individual sub-pixels and be repeatedly positioned on the wiring substrate 100. For example, each pixel area 101 may be repeatedly disposed on the wiring substrate 100.

In this regard, the pixel areas 101 may be repeatedly positioned along one line of the data electrodes (the first wiring electrodes) 121, 122, and 123 or line of the scan electrode (the second wiring electrode) 124 in a longitudinal direction. For example, in FIG. 1, the red light-emitting device 210, the green light-emitting device 220, and the blue light-emitting device 230 may be repeatedly positioned along a left and right direction. For example, a red light-emitting device of an adjacent pixel area may be positioned on a right side of the blue light-emitting device 230.

Figure 8:
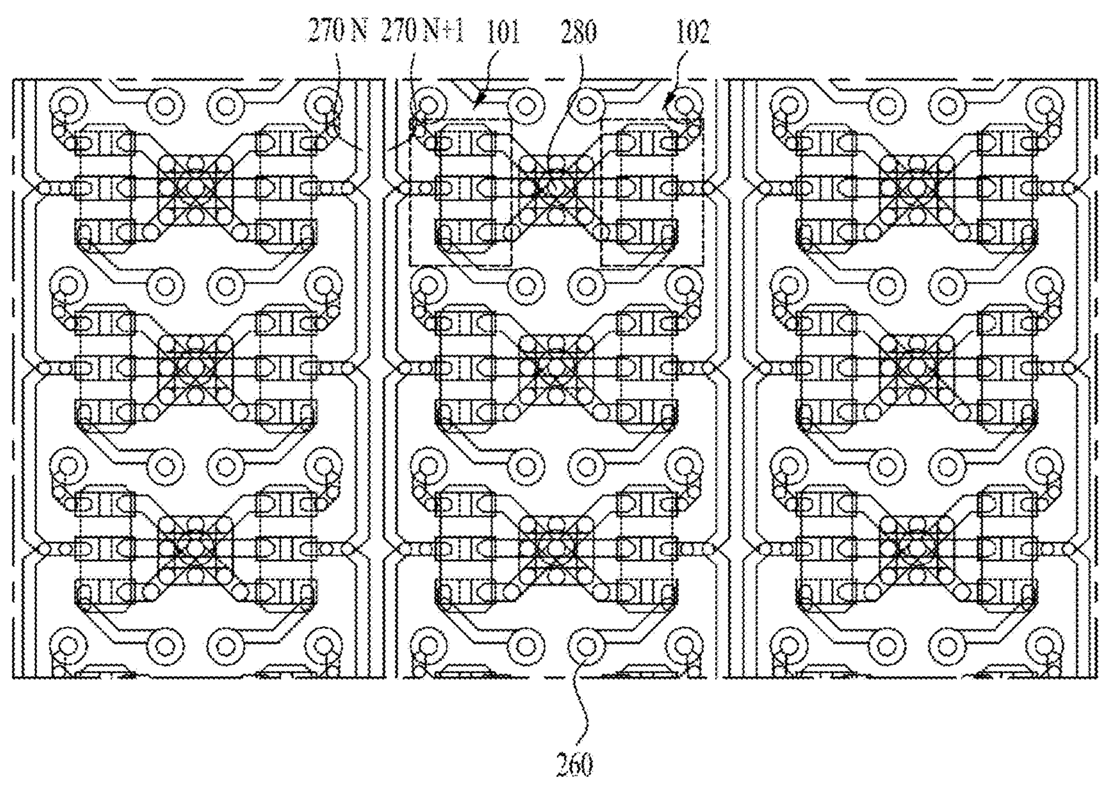
FIG. 8 is a plan view illustrating an arrangement of wiring electrodes of a display device using a semiconductor light-emitting device according to Present Example of the present disclosure.

In one example, another data electrode (first wiring electrode) line or scan electrode (second wiring electrode) line adjacent to one data electrode (first wiring electrode) line or scan electrode (second wiring electrode) line in a parallel manner may be located (see FIG. 8). In this regard, a pixel area 102 (see FIG. 8) having the same arrangement of the light-emitting devices 210, 220, and 230 as the pixel area 101 may be located on the adjacent data electrode (first wiring electrode) line or scan electrode (second wiring electrode) line.

In this case, light-emitting devices having the same color may be located adjacent to each other in adjacent pixel areas. For example, the red light-emitting device 210, the green light-emitting device 220, and the blue light-emitting device 230 may be repeatedly positioned along the data electrode (first wiring electrode) line or the scan electrode (second wiring electrode) line, but light-emitting devices having the same color may be repeatedly positioned in a direction perpendicular to such data electrode (first wiring electrode) line or the scan electrode (second wiring electrode) line.

In this regard, according to one embodiment of the present disclosure, two adjacent light-emitting devices may have different arrangements. For example, referring to FIG. 1, the red light-emitting device 210 and the green light-emitting device 220 adjacent to the red light-emitting device 210 may have different arrangements.

For example, in the red light-emitting device 210, a first-type electrode, for example, an N-type electrode, may be positioned on the first wiring electrode 130, and in the green light-emitting device 220, a second-type electrode, for example, a P-type electrode, may be positioned on the first wiring electrode 131. Such different arrangements may also be made on the green light-emitting device 220 and the blue light-emitting device 230.

That is, the red light-emitting device 210 and the green light-emitting device 220) adjacent to such red light-emitting device 210 may have symmetrical arrangements with respect to electrode positions of the respective light-emitting devices 210 and 220.

In one example, a light-emitting device (e.g., the red light-emitting device 210) located in one pixel area 101 and a light-emitting device (e.g., the red light-emitting device 210) located in the adjacent pixel area 102 may have symmetrical arrangements with respect to the electrode positions as described above.

In other words, on the wiring substrate 100, a first light-emitting device 210 located in the first pixel area 101 and installed in a first arrangement, and a second light-emitting device 210 located in the second pixel area 102 adjacent to such first pixel area 101 and installed in a second arrangement symmetric with respect to the first arrangement may be positioned.

With the first and second arrangements of the light-emitting devices 210 as described above, a parasitic capacitance generated from a difference in electrical polarity between the first light-emitting device and the second light-emitting device may be reduced.

In addition, with the first arrangement and the second arrangement of the light-emitting devices 210 as described above, an electric field generated from the difference in the electric polarity between the first light-emitting device and the second light-emitting device may be canceled.

The light-emitting devices 210 having such different arrangements and effects thereof will be described later in detail.

Figure 2:
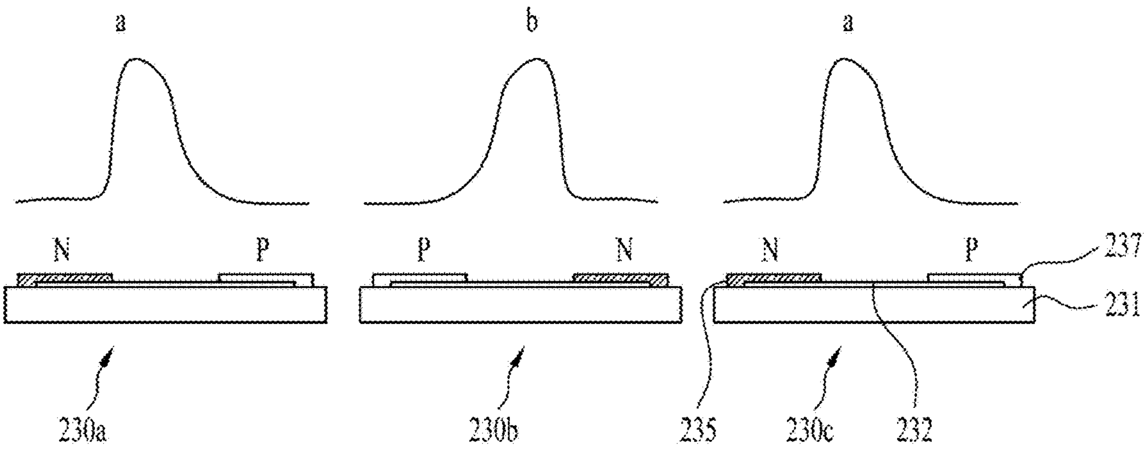
FIG. 2 is a schematic diagram illustrating a sub-pixel arrangement of a display device using a semiconductor light-emitting device according to Present Example of the present disclosure.
Figure 3:
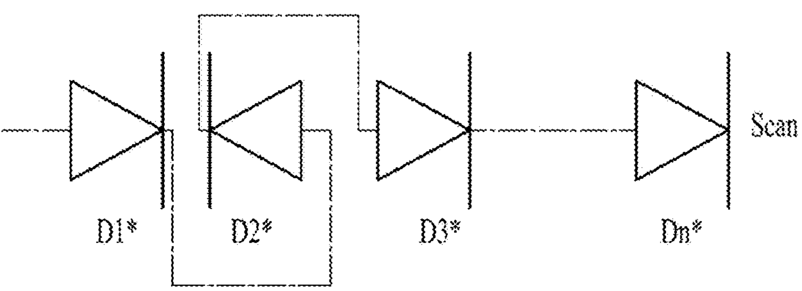
FIG. 3 is a circuit diagram illustrating a sub-pixel arrangement of a display device using a semiconductor light-emitting device according to Present Example of the present disclosure.

FIG. 2 is a schematic diagram illustrating a sub-pixel arrangement of a display device using a semiconductor light-emitting device according to Present Example of the present disclosure. In addition, FIG. 3 is a circuit diagram illustrating a sub-pixel arrangement of a display device using a semiconductor light-emitting device according to Present Example of the present disclosure.

Figure 4:
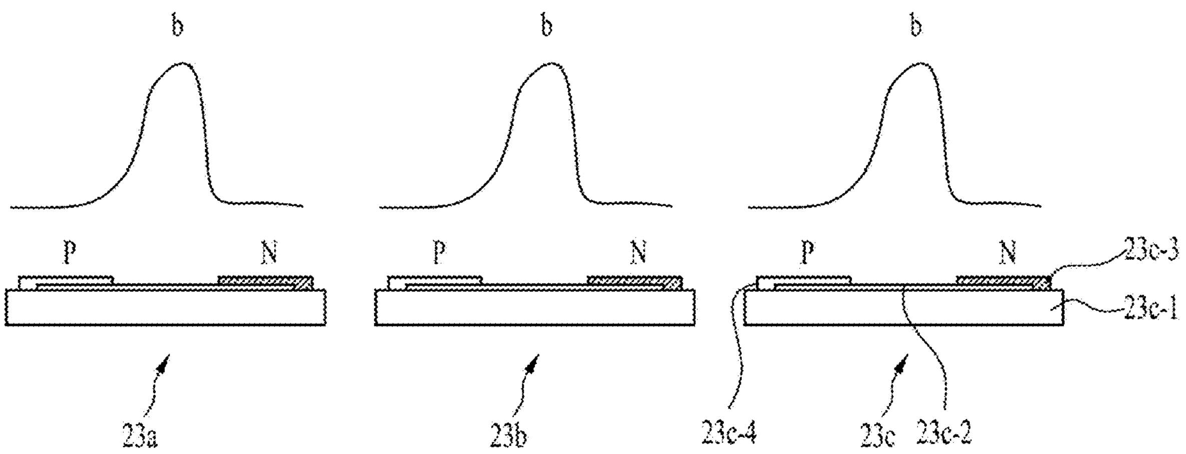
FIG. 4 is a schematic diagram illustrating a sub-pixel arrangement of a display device using a semiconductor light-emitting device according to Comparative Example.
Figure 5:
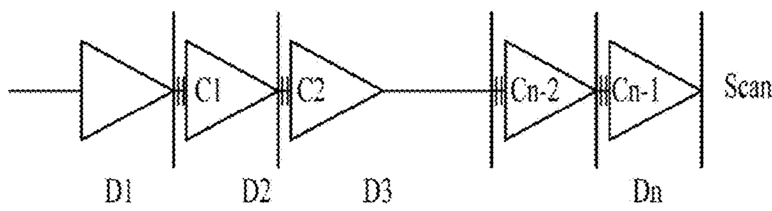
FIG. 5 is a circuit diagram illustrating a sub-pixel arrangement of a display device using a semiconductor light-emitting device according to Comparative Example.

FIG. 4 is a schematic diagram illustrating a sub-pixel arrangement of a display device using a semiconductor light-emitting device according to Comparative Example. FIG. 5 is a circuit diagram illustrating a sub-pixel arrangement of a display device using a semiconductor light-emitting device according to Comparative Example.

Referring to FIG. 2, a state in which a first light-emitting device 230*a* and a second light-emitting device 230*b* adjacent to each other are positioned in different arrangements, the first arrangement and second arrangement, is shown. In addition, the second light-emitting device 230*b* and a third light-emitting device 230*c* may also be positioned in different arrangements. Referring to FIG. 3, it may be seen that light-emitting devices D1*, D2*, D3*, . . . , Dn* may be connected to each other in arrangements that alternate and are opposite to each other.

For example, the first light-emitting device 230*a* and the third light-emitting device 230*c* may be positioned in the first arrangement, and the second light-emitting device 230*b* positioned between the first light-emitting device 230*a* and the third light-emitting device 230*c* may be positioned in the second arrangement.

In this regard, the first light-emitting device 230*a*, the second light-emitting device 230*b*, and the third light-emitting device 230*c* may all be light-emitting devices that emit light of the same color. For example, the first light-emitting device 230*a*, the second light-emitting device 230*b*, and the third light-emitting device 230*c* may all be the blue light-emitting devices.

In this regard, the first arrangement may be an arrangement in which the N-type electrode 235 is located on a left side and the P-type electrode 237 is located on a right side in FIG. 2. In each of the light-emitting devices 230*a*, 230*b*, and 230*c*, the semiconductor layer 232 may be positioned on the substrate 231, and the first-type electrode, for example, the N-type electrode 235, and the second-type electrode, for example, the P-type electrode 237, in contact with such semiconductor layer 232 may be positioned.

That is, each of the light-emitting devices 230*a*, 230*b*, and 230*c* may include the substrate 231, the semiconductor layer 232, the first-type electrode 235, and the second-type electrode 237. In this regard, each of the light-emitting devices 230*a*, 230*b*, and 230*c* may have different arrangements with respect to a direction for connecting the first-type electrode 235 and the second-type electrode 237 to each other.

Referring to FIG. 2, each of the light-emitting devices 230*a*, 230*b*, and 230*c* may have a light distribution a or b that is asymmetric with respect to the direction for connecting the first-type electrode 235 and the second-type electrode 237 to each other. For example, the first light-emitting device 230*a* and the third light-emitting device 230*c* may have the light distribution a biased to the left. This may correspond to the first arrangement. In addition, the second light-emitting device 230*b* positioned between the first light-emitting device 230*a* and the third light-emitting device 230*c* may have the light distribution b biased to the right. This may correspond to the second arrangement.

This may be resulted from material characteristics of at least one of the substrate 231 and the semiconductor layer 232. For example, such phenomenon may occur because a crystal structure of at least one of the substrate 231 and the semiconductor layer 232 has a tilted shape. This will be described later in detail.

As Comparative Example, FIG. 4 shows a case in which light-emitting devices 23*a*, 23*b*, and 23*c* have the same arrangement b and the resulting light distribution b. For example, the light-emitting device 23*c* has a semiconductor layer 23*c*-2 located on a substrate 23*c*-1, and includes a first-type electrode 23*c*-3 and a second-type electrode 23*c*-4 connected to the semiconductor layer 23*c*-2. Referring to FIG. 5, it may be seen that light-emitting devices D1, D2, D3, . . . , Dn are connected to each other with the same arrangement.

As shown in FIG. 4, when each of the light-emitting devices 23*a*, 23*b*, and 23*c* constitutes an individual sub-pixel while having the light distribution b asymmetric with respect to a direction for connecting the first-type electrode 23*c*-3 and the second-type electrode 23*c*-4 and the individual sub-pixels constitute the display device, a problem in that, when viewing the display device from the outside, a color of a display appears differently depending on a viewing direction may occur.

In the polar arrangement of the light-emitting devices 23*a*, 23*b*, and 23*c* as described above, the first-type electrode 23*c*-3 and the second-type electrode 23*c*-4 are sequentially repeated, so that the unintended parasitic capacitance may occur due to an electric field formed by a difference in polarity between the first-type electrode 23*c*-3 and the second-type electrode 23*c*-4 (or between a signal electrode/a common electrode connected thereto) of each of the light-emitting devices 23*a*, 23*b*, and 23*c*.

Accordingly, even when the electric field is dissipated, discharge of the parasitic capacitance is not normally performed, so that a situation in which an adjacent light-emitting device is unintentionally turned on may occur. For example, when the D3 is in an ON state, the D1 and the D2, which should be in an OFF state, may unintentionally remain in the ON state. The corresponding effect may be accumulated by the total number of light-emitting devices 23*a*, 23*b*, and 23*c*, and finally, a ghost phenomenon may appear in a unit of a display product.

However, as in Present Example of the present disclosure, when the adjacent light-emitting devices 230*a*, 230*b*, and 230*c* have the different arrangements with respect to the direction for connecting the first-type electrode 235 and the second-type electrode 237 to each other, such problem may be solved.

As an embodiment, FIG. 2 shows a state in which the light distributions a and b of the light-emitting devices 230*a*, 230*b*, and 230*c* are biased toward the N-type electrode 235. However, this is merely an example, not all of the light distributions of the light-emitting devices 230*a*, 230*b*, and 230*c* are biased toward the N-type electrode 235. That is, in one example, the light distributions of the light-emitting devices 230*a*, 230*b*, and 230*c* may be biased toward the P-type electrode 237.

Therefore, with the different arrangements with respect to the direction for connecting the first-type electrodes 235 to the second-type electrodes 237 of the adjacent light-emitting devices 230*a*, 230*b*, and 230*c*, such biased light distributions a and b may be canceled with each other. That is, the problem in that, when viewing the display device from the outside, the color of the display appears differently depending on the viewing direction may be solved.

With the first arrangement and the second arrangement of the light-emitting devices 230*a*, 230*b*, and 230*c*, the parasitic capacitance generated from a difference in electrical polarity between the light-emitting devices 230*a*, 230*b*, and 230*c* may be reduced.

In addition, with such first arrangement and second arrangement of the light-emitting devices 230*a*, 230*b*, and 230*c*, an electric field generated from the difference in the electric polarity between the light-emitting devices 230*a*, 230*b*, and 230*c* may be canceled.

Figure 6:
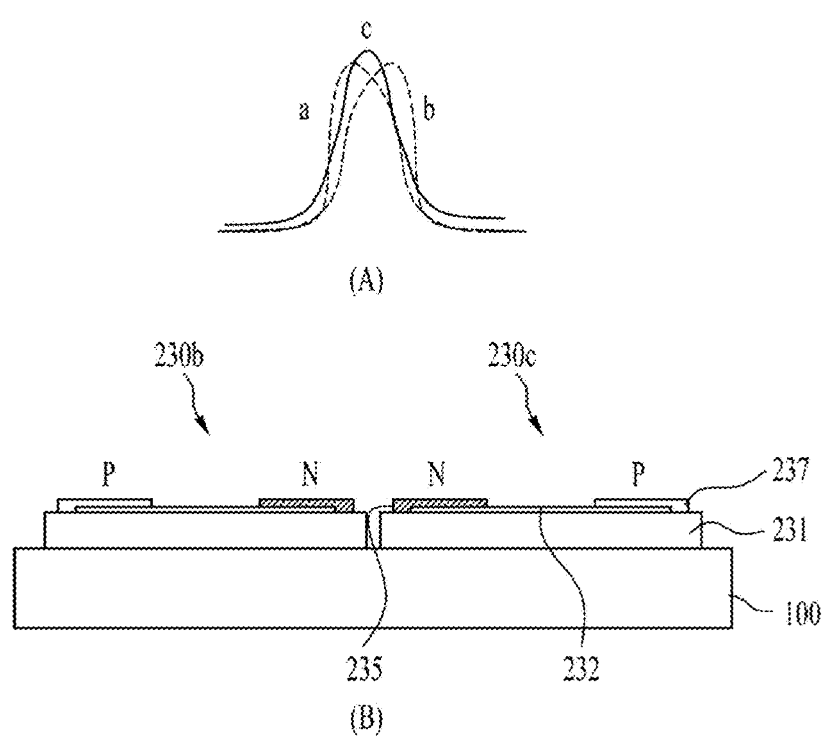
FIG. 6 is a schematic diagram illustrating an effect of a sub-pixel arrangement of a display device using a semiconductor light-emitting device according to an embodiment of the present disclosure.

FIG. 6 is a schematic diagram illustrating an effect of a sub-pixel arrangement of a display device using a semiconductor light-emitting device according to an embodiment of the present disclosure.

Referring to FIG. 6, the light-emitting devices 230*b* and 230*c* that are installed on the wiring substrate 100 and form the sub-pixels may be disposed.

In this regard, referring to (B) in FIG. 6 on a lower side, as described with reference to FIG. 1 above, the wiring substrate 100 may include the wiring electrodes 123 and 124 including the first wiring electrode 123 and the second wiring electrode 124 arranged on the wiring substrate 100, and each of the light-emitting devices 230*b* and 230*c* may be installed to be electrically connected to the first wiring electrode 123 and the second wiring electrode 124 in each unit pixel area. That is, the sub-pixel arrangement in FIG. 6 may correspond to the case of the blue light-emitting device 230 in FIG. 1.

In this regard, referring to (A) and (B) in FIG. 6 together, the light-emitting devices 230*b* and 230*c* may include a first light-emitting device 230*b* located in the first pixel area and installed in the first arrangement, and a second light-emitting device 230*c* located in the second pixel area adjacent to the first pixel area and installed in the second arrangement symmetrical to the first arrangement.

Each of the first light-emitting device 230*b* and the second light-emitting device 230*c* may include the substrate 231, the semiconductor layer 232, the first-type electrode 235, and the second-type electrode 237. In this regard, the first light-emitting device 230*b* and the second light-emitting device 230*c* may have different arrangements with respect to the direction for connecting the first-type electrode 235 and the second-type electrode 237 to each other.

Accordingly, the light distribution a biased to one side by the first arrangement and the light distribution b biased to the other side by the second arrangement may be merged together to form a light distribution 'c' that is not biased and faces the center. That is, the asymmetrical light distributions may be canceled by the first arrangement of the first light-emitting device 230*b* and the second arrangement of the second light-emitting device 230*c* as described above.

In this regard, as described above, the first light-emitting device 230*b* and the second light-emitting device 230*c* may be light-emitting devices that emit light of the same color located in the adjacent pixel areas, for example, the blue light-emitting devices.

When a positive voltage is applied to a light emitting diode (LED) with a PN junction structure, charges and holes recombine with each other in an area where a P-area and an N-area meet each other to emit light. In this regard, a portion where the greatest amount of light is emitted is not a center of the area where the P-area and the N-area meet each other, but is biased. Therefore, when a display is manufactured with such an LED, a color of the display may appear differently depending on a direction for viewing the display.

However, as described above, when the first arrangement of the first light-emitting device 230*b* and the second arrangement of the second light-emitting device 230*c* are symmetrical with each other, a color difference of the display perceived on left and right sides when viewing the display from one side may be compensated for by visually reinforcing an area with weak color. Therefore, an effect of enhancing a color viewing angle in a final product stage of the display device may be obtained.

In addition, an electric field formed by a difference in polarity between the light-emitting devices 230*b* and 230*c* may be removed by the symmetrical arrangements of the first light-emitting device 230*b* and the second light-emitting device 230*c*, so that a parasitic capacitance may be prevented from being generated. In addition, the ghost phenomenon that may occur due to such parasitic capacitance may be improved.

Figure 7:
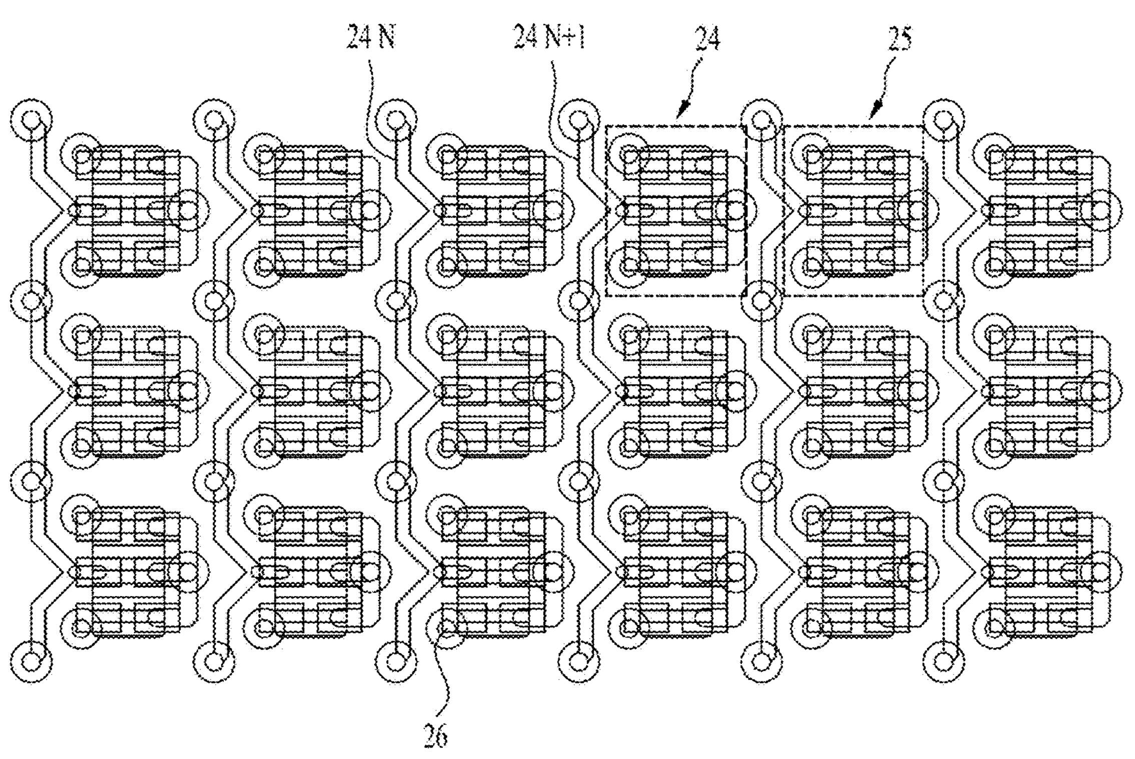
FIG. 7 is a plan view illustrating an arrangement of wiring electrodes of a display device using a semiconductor light-emitting device according to Comparative Example.

FIG. 7 is a plan view illustrating an arrangement of wiring electrodes of a display device using a semiconductor light-emitting device according to Comparative Example.

FIG. 7 shows an arrangement of wiring electrodes corresponding to the arrangement of light-emitting devices 23*a*, 23*b*, and 23*c* in FIG. 4 above. Referring to FIG. 7, some pixel areas 24 and 25 are shown, and signal electrodes 24N and 24N+1 are arranged on one side (that is, a left side) of each pixel area (e.g., 24) in the vertical direction.

In addition, it may be seen that a common electrode 27 is disposed on a right side of each pixel area 24 for the entire arrangement of the three light-emitting devices.

Referring to FIG. 7, the two adjacent pixel areas 24 and 25 have the same arrangement with respect to the signal electrodes 24N and 24N+1 and the common electrode 27. Therefore, as described with reference to FIG. 4, when the respective light-emitting devices installed in the same arrangement with respect to such signal electrodes 24N and 24N+1 and common electrode 27 constitute individual sub-pixels in a state of having the asymmetric light distribution b, and the individual sub-pixels constitute a display device, a problem in that, when viewing the display device from the outside, a color of the display appears differently depending on a viewing direction may occur.

FIG. 8 is a plan view illustrating an arrangement of wiring electrodes of a display device using a semiconductor light-emitting device according to Present Example of the present disclosure.

FIG. 8 shows an arrangement of wiring electrodes corresponding to the arrangement of the light-emitting devices 230*a*, 230*b*, and 230*c* in FIG. 2 above. Referring to FIG. 8, some pixel areas 101 and 102 are shown.

A center point 280 may be located between the two pixel areas 101 and 102, and such center point 280 may correspond to the second wiring electrode 124 described above. In addition, as mentioned above, the center point 280 may be connected to the second pads 140, 141, and 142.

Such two pixel areas 101 and 102 may be located to be symmetrical with respect to each other around the center point 280. That is, the second wiring electrode 124 may be located between such two pixel areas 101 and 102.

As described above, the three light-emitting devices 210, 220, and 230 may be installed in one pixel area 101 to constitute the respective sub-pixels. In this regard, because the two pixel areas 101 and 102 are located symmetrically with respect to each other around the center point 280, the three light-emitting devices 210, 220, and 230 located in the pixel area 101 may be located so as to be symmetrical with respect to the three light-emitting devices 210, 220, and 230 located in the pixel area 102, respectively.

In this regard, the respective light-emitting devices 210, 220, and 230 may constitute signal electrodes by an arrangement of via holes 260, and signals may be supplied from such signal electrodes. In addition, the center point 280 connected to the second wiring electrode 124 may also correspond to the via hole.

That is, when taking a light-emitting device rendering one color, for example, the blue light-emitting device 230, as an example, the first light-emitting device 230*b* (see FIG. 6) located in the first pixel area 101 and installed in the first arrangement, and the second light-emitting device 230*c* (see FIG. 6) located in the second pixel area 102 adjacent to the first pixel area 101 and installed in the second arrangement symmetrical to the first arrangement may be located.

In addition, the pixel areas 101 and 102 may be paired between first wiring electrodes 270N, 270N+1, and the like adjacent to each other. As shown in FIG. 8, the first wiring electrodes 270N, 270N+1, and the like may be located on both sides of the pair of pixel areas 101 and 102. In one example, considering an adjacent pixel area, the two first wiring electrodes 270N and 270N+1 may be located close to each other and parallel to each other.

As such, because the three light-emitting devices 210, 220, and 230 located in the pixel area 101 and the three light-emitting devices 210, 220, and 230 located in the pixel area 102 are positioned symmetrically with respect to each other around the second wiring electrode 124, one light-emitting device and a counterpart thereof are disposed such that electrodes of the same polarity face each other, thereby using a via hole in common. Therefore, the number of via holes for supplying power to the light-emitting devices 210, 220, and 230 may be reduced by approximately 50% compared to that in the case in FIG. 7, and the number of scan electrodes (second wiring electrodes) 124 may also be reduced compared to that in the case in FIG. 7.

The via hole is caused by an inductance component, so that there is a possibility that the via hole may be mixed with a signal noise component. Therefore, it is advantageous when the number of via holes is as small as possible in a circuit substrate. As such, according to the embodiment of the present disclosure, a signal may be further stabilized by reducing the number of via holes. In addition, a difficulty of manufacturing the circuit substrate may be reduced, and accordingly, a manufacturing time and a manufacturing cost of the circuit substrate may be reduced.

In addition, as described above, the electric field formed by the difference in the polarity between the light-emitting devices 230_b_ and 230_c_ may be removed by the symmetrical arrangement of the first light-emitting device 230_b_ and the second light-emitting device 230_c_, so that the occurrence of the parasitic capacitance may be prevented.

In general, the capacitance exhibits a characteristic that is inversely proportional to a distance. With the circuit pattern shown in FIG. 8, because a distance between the first wiring electrodes 270N, 270N+1, and the like is approximately doubled with respect to the pixel areas 101 and 102, the capacitance may be reduced by approximately half.

Figure 9:
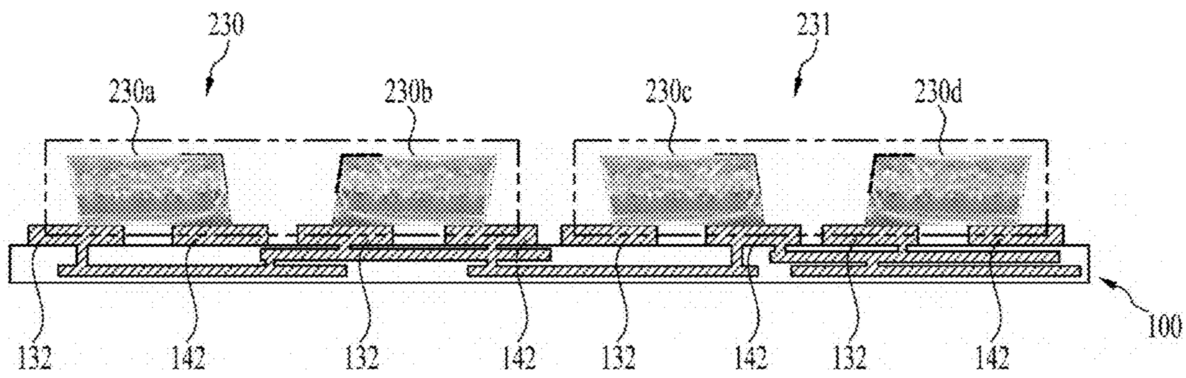
FIG. 9 is a schematic diagram illustrating a specific example of a sub-pixel arrangement of a display device using a semiconductor light-emitting device according to an embodiment of the present disclosure.

FIG. 9 is a schematic diagram illustrating a specific example of a sub-pixel arrangement of a display device using a semiconductor light-emitting device according to an embodiment of the present disclosure.

Referring to FIG. 9, a state in which light-emitting devices 230_a_, 230_b_, 230_c_, and 230_d_ are installed in a symmetrical arrangement on the wiring substrate 100 is shown. This may correspond to a state in which the arrangement of the light-emitting devices shown in FIG. 6 continues in a parallel manner.

As mentioned above, the light-emitting devices 230_a_, 230_b_, 230_c_, and 230_d_ may have the asymmetric light distributions a and b with respect to the direction for connecting the first-type electrode 235 and the second-type electrode 237 to each other. In addition, the light-emitting devices 230_a_, 230_b_, 230_c_, and 230_d_ may have the asymmetric light distributions a and b (see FIG. 2) with respect to the direction for connecting the first electrode pad 132 and the second electrode pad 142 to each other.

For example, the first light-emitting device 230_a_ and the third light-emitting device 230_c_ may have the light distribution a biased to the left. This may correspond to the first arrangement. In addition, the second light-emitting device 230_b_ positioned between the first light-emitting device 230_a_ and the third light-emitting device 230_c_ and the fourth light-emitting device 230_d_ positioned on a right side of the third light-emitting device 230_c_ may have the light distribution b biased to the right. This may correspond to the second arrangement.

This may be resulted from the material characteristics of at least one of the substrate 231 and the semiconductor layer 232. For example, such phenomenon may occur because the crystal structure of at least one of the substrate 231 and the semiconductor layer 232 has the tilted shape. This will be described later in detail.

FIG. 9 shows a state in which each of the light-emitting devices 230_a_, 230_b_, 230_c_, and 230_d_ has a tilted crystal structure. In particular, considering an area (hereinafter, a first area 230) in which two adjacent pixels form a pair, the first light-emitting device 230_a_ of one pixel and the second light-emitting device 230_b_ of the other pixel may be tilted symmetrical to each other to have the same tilt angles in opposite directions. For example, the first light-emitting device 230_a_ and the second light-emitting device 230_b_ may be tilted in a direction away from each other. In addition, in a second area 231 adjacent to the first area 230, the third light-emitting device 230_c_ and the fourth light-emitting device 230_d_ of the other pixel may be tilted symmetrical to each other to have the same tilt angles in opposite directions.

Figure 10:
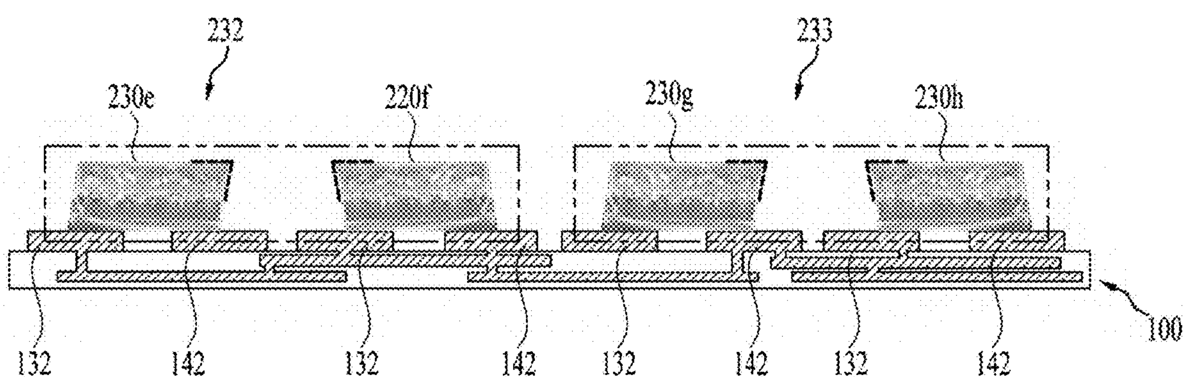
FIG. 10 is a schematic diagram showing another specific example of a sub-pixel arrangement of a display device using a semiconductor light-emitting device according to an embodiment of the present disclosure.

FIG. 10 is a schematic diagram showing another specific example of a sub-pixel arrangement of a display device using a semiconductor light-emitting device according to an embodiment of the present disclosure.

Referring to FIG. 10, a state in which light-emitting devices 230_e_, 230_f_, 230_g_, and 230_h_ are installed in a symmetrical arrangement on the wiring substrate 100 is shown. This may correspond to the state in which the arrangement of the light-emitting devices shown in FIG. 6 continues in the parallel manner.

As mentioned above, the light-emitting devices 230_e_, 230_f_, 230_g_, and 230_h_ may have the asymmetric light distributions a and b with respect to the direction for connecting the first-type electrode 235 and the second-type electrode 237 to each other. In addition, the light-emitting devices 230_e_, 230_f_, 230_g_, and 230_h_ may have the asymmetric light distributions a and b (see FIG. 2) with respect to the direction for connecting the first electrode pad 132 and the second electrode pad 142 to each other.

FIG. 10 shows a state in which each of the light-emitting devices 230_e_, 230_f_, 230_g_, and 230_h_ has a tilted crystal structure. In particular, considering an area (hereinafter, a third area 232) in which two adjacent pixels form a pair, the fifth light-emitting device 230_e_ of one pixel and the sixth light-emitting device 230_f_ of the other pixel may be tilted symmetrical to each other to have the same tilt angles in opposite directions. For example, the fifth light-emitting device 230_e_ and the sixth light-emitting device 230_f_ may be tilted in a direction closer to each other. In addition, in a fourth area 233 adjacent to the third area 232, the seventh light-emitting device 230_g_ and the eighth light-emitting device 230_h_ of the other pixel may have be tilted symmetrical to each other to have the same tilt angles in opposite directions.

Figure 11:
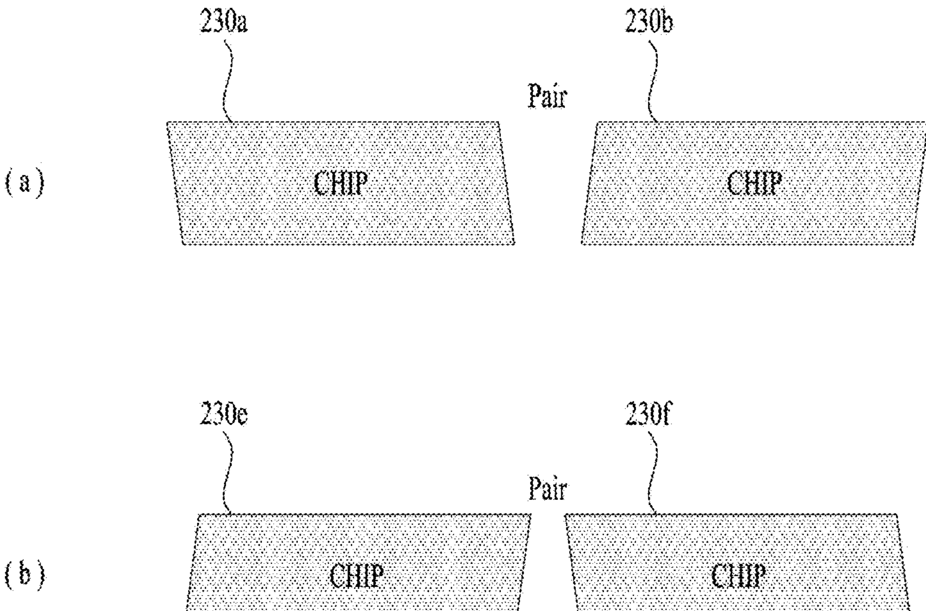
FIG. 11 is a diagram schematically illustrating sub-pixel arrangements in FIGS. 9 and 10.

FIG. 11 is a diagram schematically illustrating sub-pixel arrangements in FIGS. 9 and 10.

(a) in FIG. 11 schematically illustrates the state in which the pair of first light-emitting device 230_a_ and second light-emitting device 230_b_ are tilted in the direction away from each other in the first area 230 in FIG. 9.

In addition, (b) in FIG. 11 schematically illustrates the state in which the pair of the fifth light-emitting device 230_e_ and the sixth light-emitting device 230_f_ are tilted in the direction closer to each other in the third area 232 in FIG. 10.

As described above, when the light-emitting devices in the pixels adjacent to each other are paired with each other and positioned symmetrical with respect to each other, the biased light distributions a and b caused by the crystal structure of the light-emitting devices may cancel each other. That is, the problem in that, when viewing the display device from the outside, the color of the display appears differently depending on the viewing direction may be solved.

Figure 12:
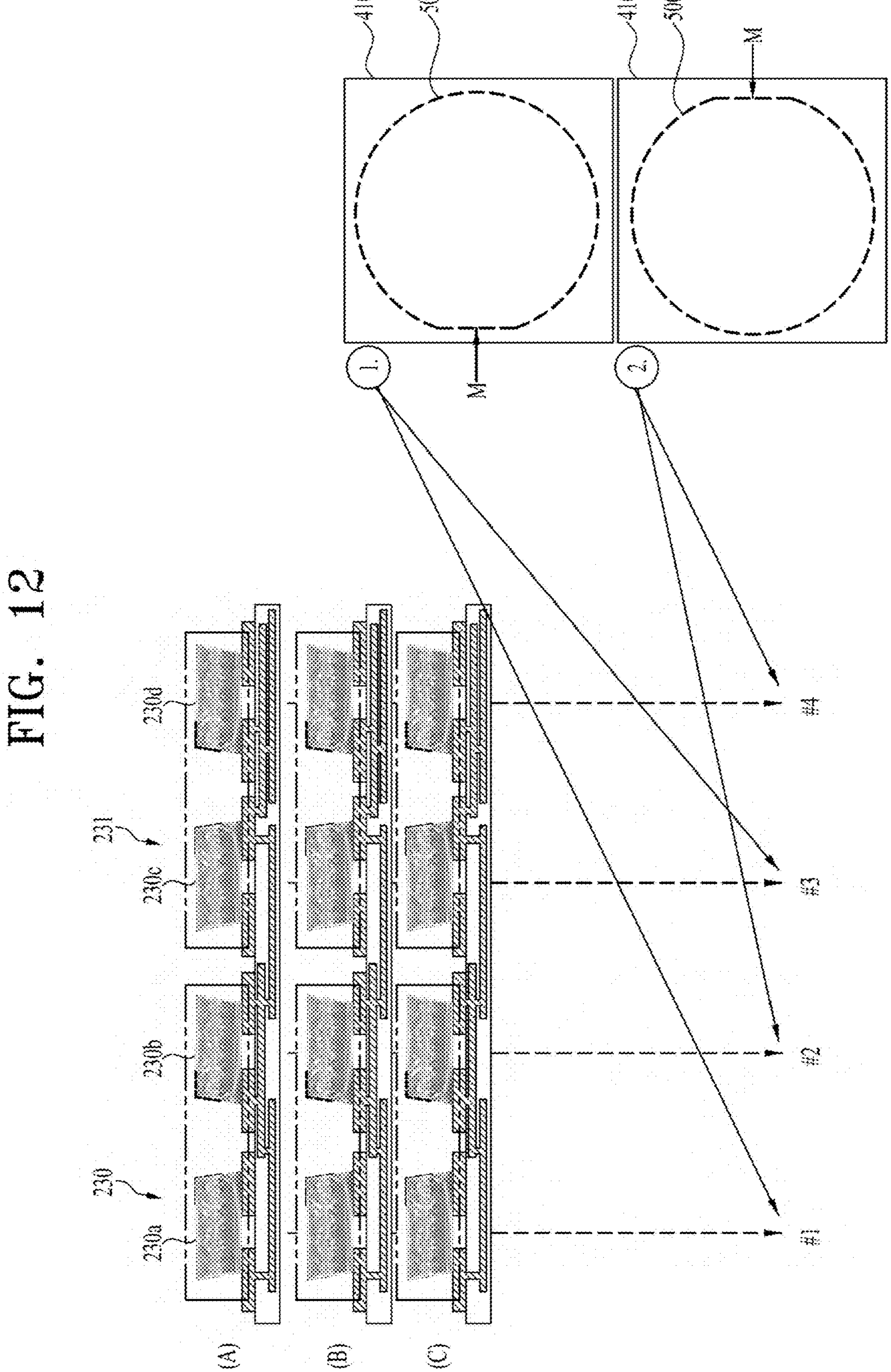
FIG. 12 is a schematic diagram illustrating a process of forming the sub-pixel arrangement according to FIG. 9.

FIG. 12 is a schematic diagram illustrating a process of forming the sub-pixel arrangement according to FIG. 9.

An example of a method for transferring the light-emitting devices to have the different arrangements will be briefly described with reference to FIG. 12.

For example, the light-emitting devices 230_a_ and 230_c_ may be first transferred to electrode pads in odd-numbered rows of the wiring substrate #1, #3, and the like, and then the light-emitting devices 230_b_ and 230_d_ may be transferred to electrode pads in even-numbered rows of the wiring substrate #2, #4, and the like after rotating the positions of the light-emitting devices by 180 degrees.

The light-emitting devices 230_a_ to 230_d_ may be transferred to a transfer substrate 410 from a state of being positioned on a wafer 500, and then, transferred to the wiring substrate. In this regard, the transfer substrate 410 may be, for example, a blue tape.

First, the light-emitting devices 230_a_ and 230_c_ may be transferred to the transfer substrate 410 in an arrangement state as shown in ① on an upper side (a reference point M of the wafer 500 is located on a left side).

Subsequently, the light-emitting devices 230_a_ and 230_c_ transferred to the transfer substrate 410 may be transferred to the electrode pads in the odd-numbered rows of the wiring substrate #1, #3, and the like.

Thereafter, in a state in which the wafer 500 is rotated by 180 degrees as shown in ② on a lower side (the reference point M of the wafer 500 is located on a right side), the light-emitting devices 230*b* and 230*d* may be transferred to the transfer substrate 410.

Subsequently, the light-emitting devices 230*b* and 230*d* transferred to the transfer substrate 410 may be transferred to the electrode pads in the even-numbered rows of the wiring substrate #2, #4, and the like.

With such process, the light-emitting devices 230*a* to 230*h* having the arrangements as shown in FIGS. 9 to 11 may be transferred onto the wiring substrate.

Figure 13:
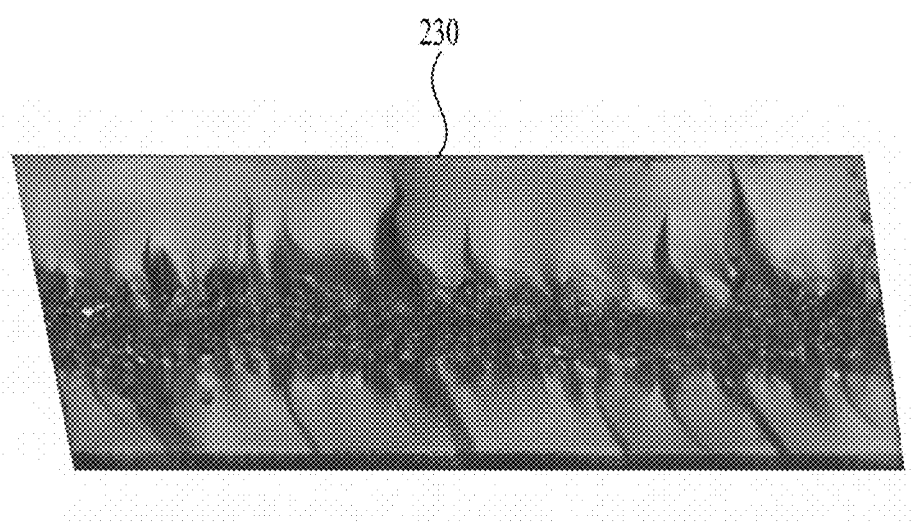
FIG. 13 is a side picture showing an individual light-emitting device of a display device using a semiconductor light-emitting device according to an embodiment of the present disclosure.
Figure 14:
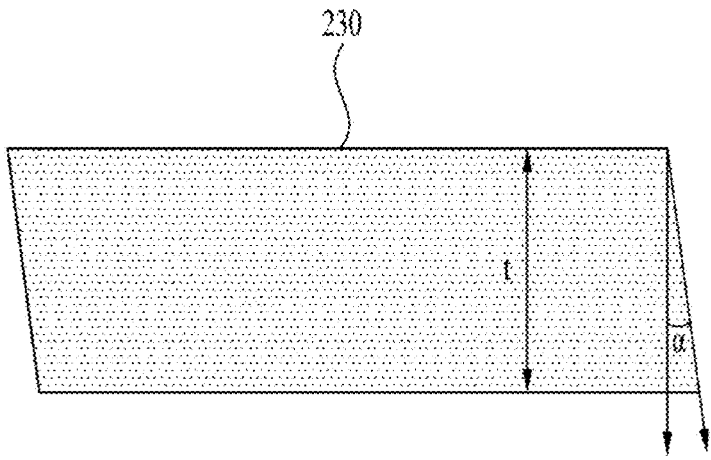
FIG. 14 is a schematic diagram illustrating a tilt angle of an individual light-emitting device of a display device using a semiconductor light-emitting device according to an embodiment of the present disclosure.

FIG. 13 is a side picture showing an individual light-emitting device of a display device using a semiconductor light-emitting device according to an embodiment of the present disclosure. FIG. 14 is a schematic diagram illustrating a tilt angle of an individual light-emitting device of a display device using a semiconductor light-emitting device according to an embodiment of the present disclosure.

FIG. 13 is an enlarged picture showing a side surface of the blue light-emitting device 230. FIG. 13 may show a sapphire substrate occupying most of a thickness of the blue light-emitting device 230. As shown in FIG. 14, a tilt angle $\alpha$ of the blue light-emitting device 230 may be approximately 10 degrees. In addition, as an example, a thickness t of the blue light-emitting device 230 may be 80 μm.

However, the gallium nitride-based semiconductor layer positioned on the sapphire substrate may have the same or similar tilt angle. In some cases, the sapphire substrate is removed after the light-emitting device is manufactured. In this case, in the light-emitting device, the gallium nitride-based semiconductor layer, not the substrate, may have the tilt angle as described above.

Figure 15:
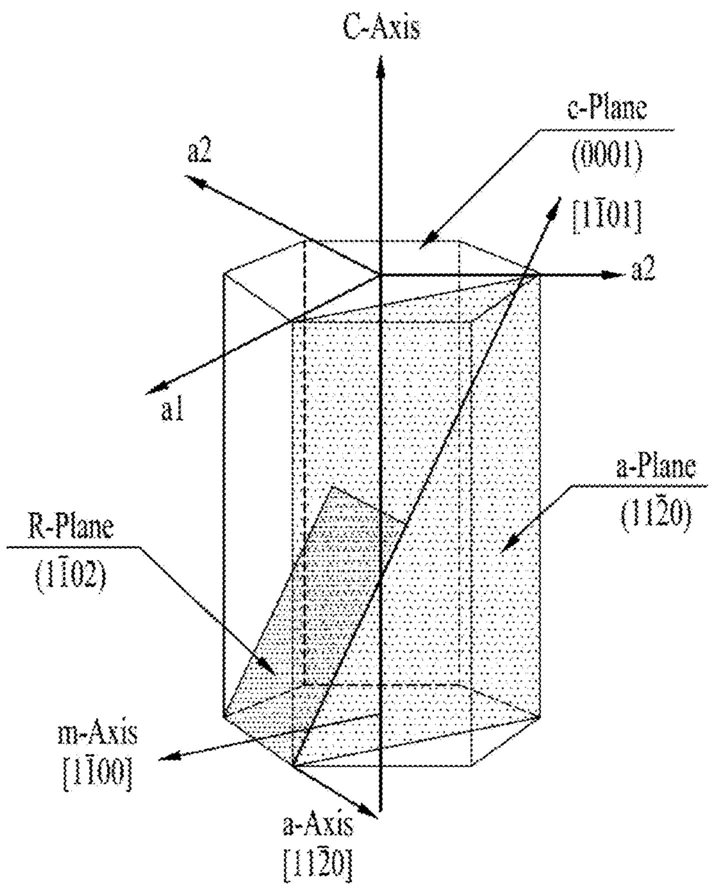
FIG. 15 schematically illustrates a crystal surface and a crystal direction of sapphire.

FIG. 15 schematically illustrates a crystal surface and a crystal direction of sapphire. The sapphire may be used as a growth substrate for a light-emitting device made of a gallium nitride-based semiconductor.

As shown, the sapphire has a tilted crystal surface. As an example, an R-plane has a crystal surface tilted along an m-axis. Ordinary sapphire may have the R-plane as a growth plane thereof. Referring to FIG. 15, because the R-plane has a tilted plane with respect to a hexagonal prism crystal shape, the sapphire substrate and the gallium nitride-based semiconductor grown on the crystal surface of the sapphire substrate may have such a tilt angle.

In addition, such a tilt angle may also be formed as the light-emitting device is formed as the gallium nitride-based semiconductor on the sapphire substrate and then is cut in the direction of the crystal surface of the sapphire substrate.

Figure 16:
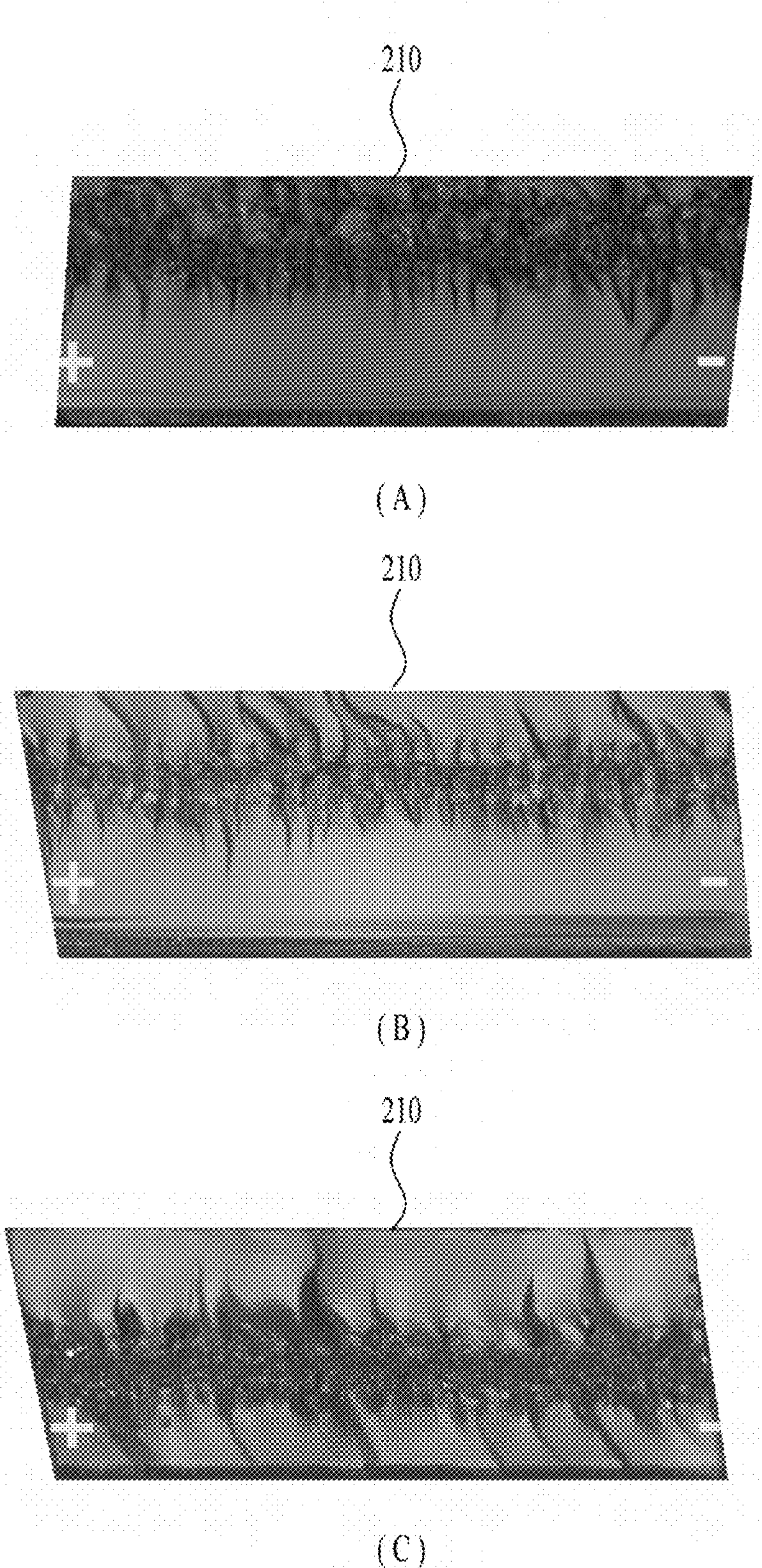
FIG. 16 shows side pictures showing light-emitting devices of a display device using a semiconductor light-emitting device according to an embodiment of the present disclosure.

FIG. 16 shows side pictures showing light-emitting devices of a display device using a semiconductor light-emitting device according to an embodiment of the present disclosure. In addition, FIG. 17 shows schematic diagrams illustrating tilt angles of light-emitting devices of a display device using a semiconductor light-emitting device according to an embodiment of the present disclosure.

Figure 17:
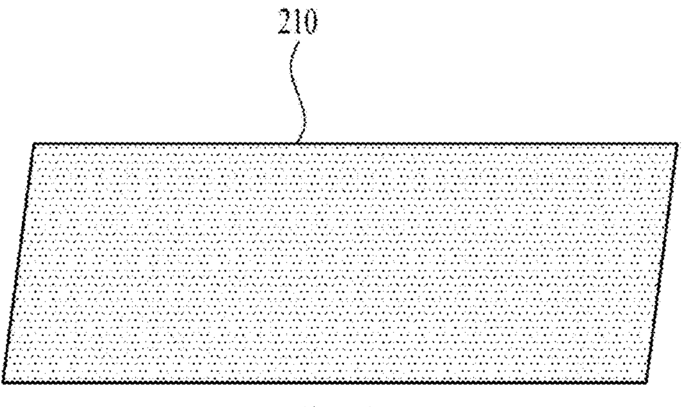
FIG. 17 shows schematic diagrams illustrating tilt angles of light-emitting devices of a display device using a semiconductor light-emitting device according to an embodiment of the present disclosure.
Figure 17:
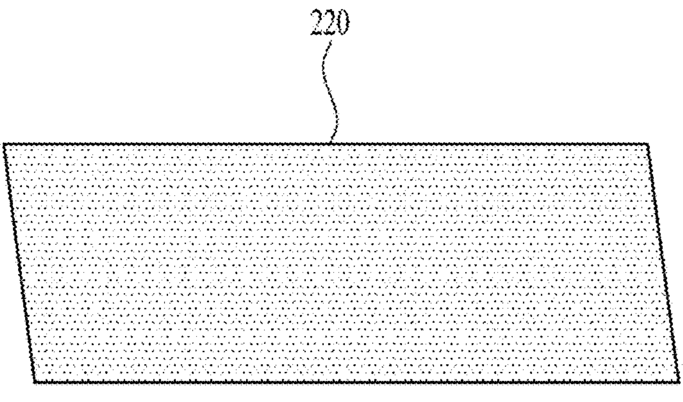
Figure 17:
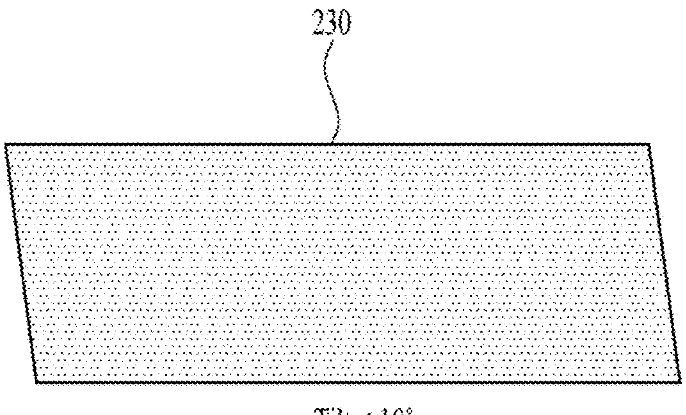

Referring to FIGS. 16 and 17, light-emitting devices that may be used in the display may have various tilt angles. As an example, a light-emitting device shown in (A) in FIG. 16 and (A) in FIG. 17 may have a tilt angle equal to or smaller than 5 degrees in one direction.

In addition, a light-emitting device shown in (B) in FIG. 16 and (B) in FIG. 17 may have a tilt angle equal to or smaller than 12 degrees in a direction opposite to that of the tilt angle of the light-emitting device shown in (A) in FIG. 16 and (A) in FIG. 17.

Further, a light-emitting device shown in (C) in FIG. 16 and (C) in FIG. 17 may have a tilt angle equal to or smaller than 10 degrees in the same direction as that of the tilt angle of the light-emitting device shown in (B) in FIG. 16 and (B) in FIG. 17.

As such, a lateral cross-section of the light-emitting device has a parallelogram structure tilted to one side, so that, as described above, the light emitting device may have a light emitting pattern that is uneven and biased to one side with respect to the direction perpendicular to the surface.

Figure 18:
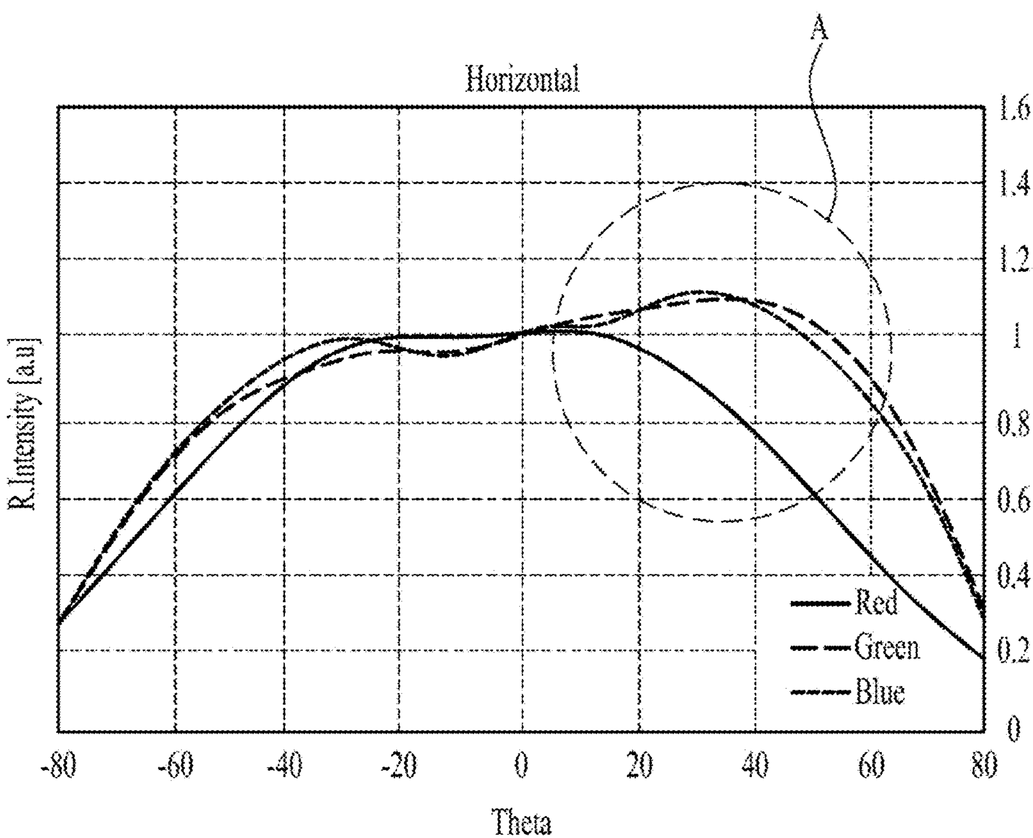
FIG. 18 is a graph illustrating an example of light distribution of a light-emitting device used in a display device using a semiconductor light-emitting device according to an embodiment of the present disclosure.
Figure 18:
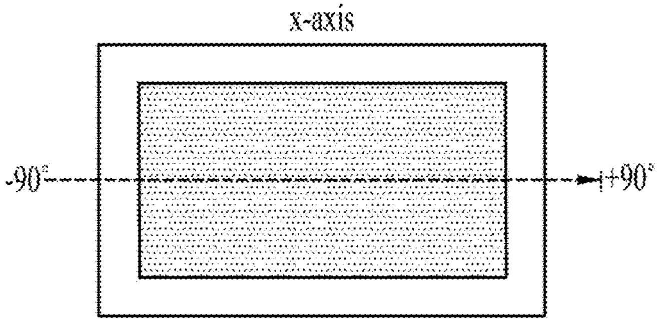
Figure 19:
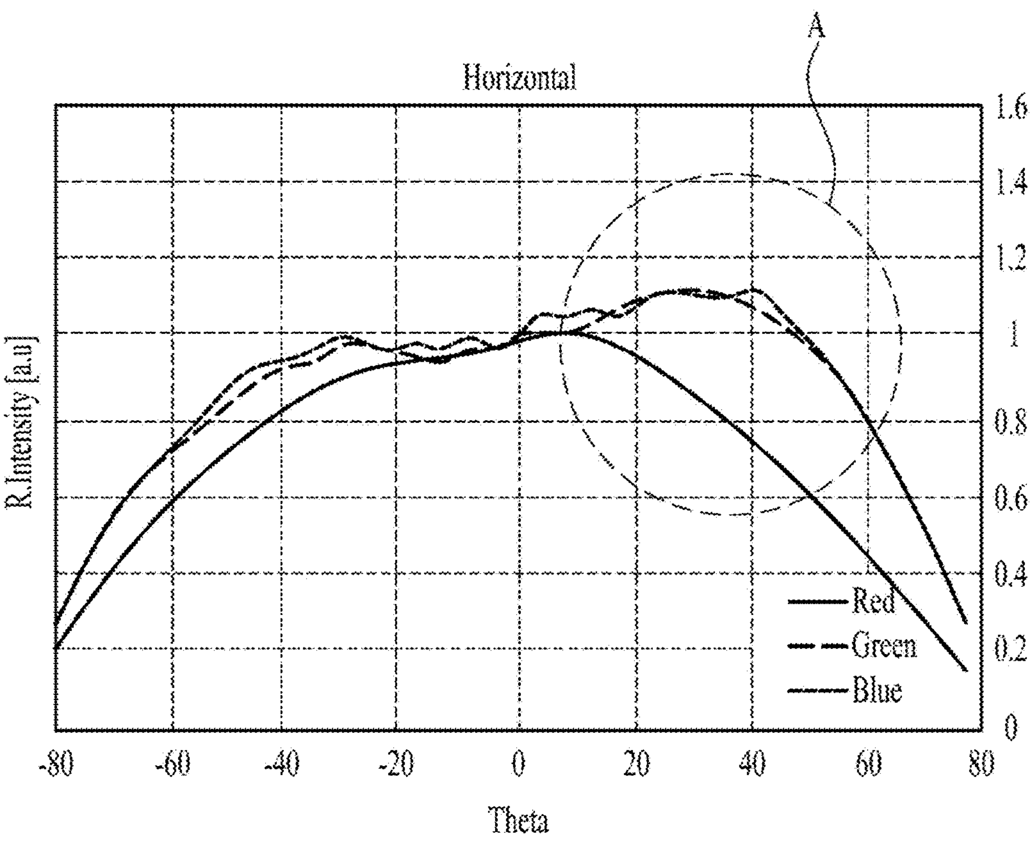
FIG. 19 is a graph illustrating another example of light distribution of a light-emitting device used in a display device using a semiconductor light-emitting device according to an embodiment of the present disclosure.
Figure 19:
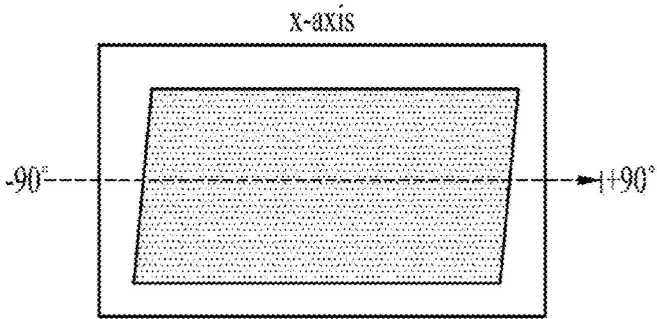

FIG. 18 is a graph illustrating an example of light distribution of a light-emitting device used in a display device using a semiconductor light-emitting device according to an embodiment of the present disclosure. FIG. 19 is a graph illustrating another example of light distribution of a light-emitting device used in a display device using a semiconductor light-emitting device according to an embodiment of the present disclosure.

FIGS. 18 and 19 both show light intensity measured along a long axis (an x-axis) of the light-emitting device. That is, a center of the long axis corresponds to 0 degree, and the light intensity is expressed at left and right sides.

FIG. 18 shows light distributions of respective red, green, and blue light-emitting devices. As shown, it may be seen that the light distributions are asymmetric at the left and right sides around the center.

Referring to FIG. 18, light distributions having a greater light intensity in a portion A on the right side based on 0 degrees is shown. Similarly, referring to FIG. 19, light distributions having a greater light intensity in a portion B on the right side based on 0 degrees is shown.

Figure 20:
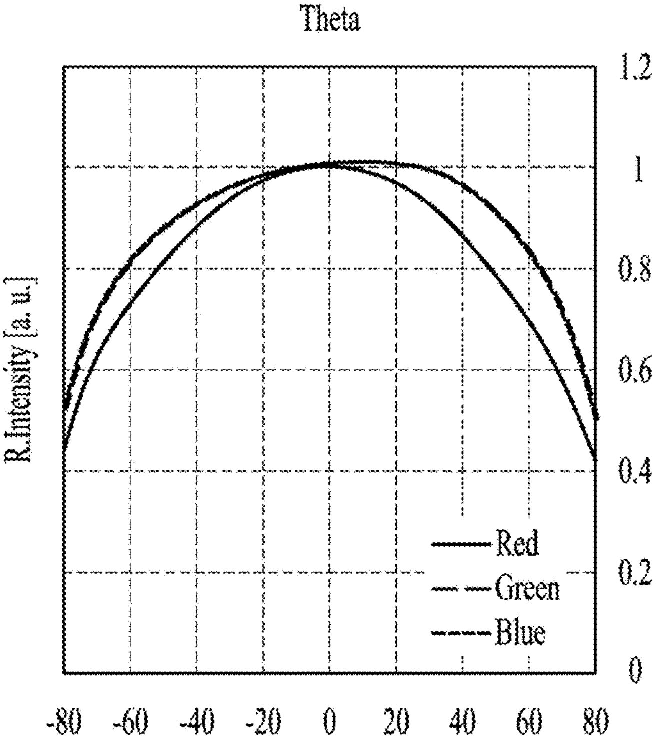
FIG. 20 shows light distribution uniformized as biased light distributions shown in FIG. 18 or 19 cancel each other.

FIG. 20 shows light distribution uniformized as biased light distributions shown in FIG. 18 or 19 cancel each other. That is, referring to FIG. 20, it may be seen that the light distribution as in FIG. 18 is uniformized based on the arrangement of the light-emitting devices described with reference to FIGS. 9 to 11.

As such, when the light-emitting devices in the pixels adjacent to each other are paired with each other and positioned symmetrical with respect to each other, the biased light distributions a and b caused by the crystal structure of the light-emitting devices may cancel each other, so that the uniform light distribution may be achieved.

Accordingly, the problem in that, when viewing the display device from the outside, the color of the display appears differently depending on the viewing direction may also be solved.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

INDUSTRIAL APPLICABILITY

According to the present disclosure, the display device using the semiconductor light-emitting device such as the micro LED may be provided.

What is claimed is:

1. A display device comprising:

a wiring substrate defining a plurality of pixel regions;

a wiring electrode including a first wiring electrode and a second wiring electrode arranged on the wiring substrate; and a plurality of light-emitting elements each electrically connected to the first wiring electrode and the second wiring electrode to form a sub-pixel within a corresponding pixel region, wherein the plurality of light-emitting elements include:

a first light-emitting element located in a first pixel region; and a second light-emitting element located in a second pixel region adjacent to the first pixel region, wherein the first light-emitting element and the second light-emitting element emit light of the same color, wherein side surfaces of the first light-emitting element include a first side and a second side tilted toward a first direction, and wherein side surfaces of the second light-emitting element include a third side and a fourth side tilted toward a second direction.

2. The display device of claim 1, wherein a distance between the first side and the third side increases moving further away from the wiring substrate.

3. The display device of claim 2, wherein a distance between the second side and the fourth side increases moving further away from the wiring substrate.

4. The display device of claim 2, wherein the light-emitting elements further include a third light-emitting element located in a third pixel region adjacent to the second pixel region, and the first, second, and third light-emitting elements emit light of the same color.

5. The display device of claim 4, wherein side surfaces of the third light-emitting element includes a fifth side and a sixth side tilted in the first direction.

6. The display device of claim 5, wherein a distance between the third side and the fifth side decreases moving further away from the wiring substrate.

7. The display device of claim 6, wherein a distance between the fourth side and the sixth side decreases moving further away from the wiring substrate.

8. The display device of claim 1, wherein a distance between the first side and the third side decreases moving further away from the wiring substrate.

9. The display device of claim 8, wherein the light-emitting elements further include a third light-emitting element located in a third pixel region adjacent to the second pixel region, and the first, second, and third light-emitting elements emit light of the same color.

10. The display device of claim 9, wherein a side surface of the third light-emitting element includes a fifth side and a sixth side tilted in the first direction.

11. The display device of claim 10, wherein a distance between the third side and the fifth side increases moving further away from the wiring substrate.

12. The display device of claim 11, wherein a distance between the fourth side and the sixth side increases moving further away from the wiring substrate.

13. The display device of claim 1, wherein the first direction and the second direction are opposite directions.

14. The display device of claim 1, wherein respective electrode polarities of the first light-emitting element and the second light-emitting element are symmetrical to each other with respect to a point between the first light-emitting element and the second light-emitting element.

15. The display device of claim 1, wherein the second side of the first light emitting element and the third side of the second light emitting element are connected to the second wiring electrode, and are electrically connected to each other in a region between the first light-emitting element and the second light-emitting element.

16. The display device of claim 15, wherein the second side of the first light emitting element and the third side of the second light emitting element have a same polarity.

* * * * *